(12) United States Patent
Englekirk

(10) Patent No.: US 9,667,255 B2
(45) Date of Patent: May 30, 2017

(54) MULTIPLE GATE VOLTAGE GENERATION FOR FET SWITCHES IN RADIO FREQUENCY CIRCUITS

(71) Applicant: Peregrine Semiconductor Corporation, San Diego, CA (US)

(72) Inventor: Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/926,929

(22) Filed: Oct. 29, 2015

(65) Prior Publication Data

US 2017/0126226 A1    May 4, 2017

(51) Int. Cl.
*H03K 17/687* (2006.01)
*H03K 19/0185* (2006.01)

(52) U.S. Cl.
CPC . *H03K 19/018585* (2013.01); *H03K 17/6871* (2013.01); *H03K 19/018507* (2013.01)

(58) Field of Classification Search
CPC . H02M 3/07; H03K 17/6871; H03K 19/0175; H03K 19/017509; H03K 19/017581; H03K 19/0185; H03K 19/018507; H03K 19/018585
USPC ............... 326/82, 83, 86; 327/108, 109, 333
See application file for complete search history.

(56) References Cited

U.S. PATENT DOCUMENTS

| | | | | |
|---|---|---|---|---|
| 8,786,322 B2* | 7/2014 | Heo | ...................... | H03K 17/164 326/82 |
| 2005/0099224 A1* | 5/2005 | Itoh | ......................... | G05F 1/565 327/541 |
| 2006/0250183 A1* | 11/2006 | Zhao | ..................... | H03F 1/0277 330/251 |
| 2014/0132585 A1* | 5/2014 | Youn | ..................... | G09G 3/3611 345/212 |
| 2015/0137913 A1 | 5/2015 | Costa | | |
| 2016/0240258 A1* | 8/2016 | Yamaha | ............ | H01L 27/11517 |

* cited by examiner

*Primary Examiner* — William Hernandez
(74) *Attorney, Agent, or Firm* — Jaquez Land Greenhaus LLP; Martin J. Jaquez, Esq.; John Land, Esq.

(57) ABSTRACT

Circuits and corresponding methods that provide for selection among multiple different positive and/or multiple different negative FET gate drive voltages for FETs in which well-tuned gate drive voltages are needed or desirable for optimal results in a radio frequency integrated circuit. Embodiments include FET gate drive variable voltage generator configurations which provide multiple different positive and/or multiple different negative FET gate drive voltages. In alternative embodiments, an IC may include multiple positive voltage generators and/or multiple negative voltage generators, each voltage generator providing an output voltage different from at least one other voltage generator. The voltage generators include charge pump based circuits and digital-to-analog converters. Each FET device requiring a well-tuned gate drive voltage is selectably coupled to at least one set of positive and negative voltage generators.

26 Claims, 6 Drawing Sheets

MULTIPLE GATE VOLTAGE GENERATION FOR FET SWITCHES IN RADIO FREQUENCY CIRCUITS

BACKGROUND (1) Technical Field

This invention relates to electronic circuits, and more particularly to gate voltage generation circuits for field effect transistor switch devices in radio frequency circuits.

(2) Background

Field effect transistors (FETs) are common circuit elements in modern electronic systems, and comprise a semiconductor body having a source, a drain, and a control gate. FETs may be fabricated in a number of integrated circuit (IC) technologies, such as the well-known standard bulk silicon, silicon-on-insulator (SOI) (including silicon-on-sapphire, or "SOS"), GaAs pHEMT, and MESFET IC technologies. One common use of field effect transistors (FETs) is as signal switching devices in radio frequency (RF) circuits.

Not all FETs have the same electrical characteristics, which often vary by fabrication process. For example, SOI-based FETs for switching RF signals typically require well-tuned gate drive voltages for optimal results. Typically, larger gate voltages allow for better RF characteristics (e.g., linearity, power handling capability), but can also lead to higher body leakage and to increased device stress, which can limit lifetime. Thus, in setting the gate voltage of an RF signal switching FET, a compromise must be made between performance, reliability, and power consumption required to overcome body leakage.

Focusing now on gate voltages for FET switch devices for RF applications that are fabricated in an SOI technology (including SOS), and in fabrication technologies having similar characteristics, in the oldest generations of such FETs, it was common to use the positive IC voltage supply, $+V_{DD}$, to turn a FET "ON", and the negative IC voltage supply, $-V_{DD}$, to turn the FET "OFF". In a next generation, it became common to use the positive IC voltage supply, $+V_{DD}$, to turn a FET "ON", but to use a negative voltage other than $-V_{DD}$ to turn the FET "OFF". Currently it is common to use a positive voltage other than $+V_{DD}$ to turn a FET "ON", and to use a negative voltage other than $-V_{DD}$ to turn the FET "OFF". Modern RF ICs fabricated in an SOI technology typically use precision reference voltages to set fixed positive and negative FET gate drive voltages independent of the IC voltage supply, $V_{DD}$, and its inverse, $-V_{DD}$. (Note that in some types of FETs, such as enhancement mode FETs, the OFF state gate voltage may be zero volts; accordingly, more generally, as used herein, "positive voltage" or "positive gate voltage" means the voltage level required to turn a FET "ON", and "negative voltage" or "negative gate voltage" means the voltage level required to turn a FET "OFF").

In some RF circuit applications utilizing such FET switch devices, there may be high and low performance channels. One example is a radio transmit/receive circuit with FET switch devices defining signal paths—the transmit signal path generally requires a low insertion loss (IL) and high voltage standoff capability, while the receive signal path has less stringent IL and voltage standoff requirements. Typically, the FET gate drive voltage which creates the best RF performance in a particular RF signal path (e.g., the transmit signal path) is chosen for all of such FETs, which exposes the FETs in other signal paths to non-optimal or more stressful conditions due to a higher applied gate drive voltage.

In a number of cases (such as in factory characterization testing or component qualification testing), in order to evaluate the lifetime of an RF circuit with FET switch devices, it is desirable to overdrive the FET gate voltage to stress the FET device. Increased device stress reduces lifetime, and thus shortens testing time. However, this has not been possible with fixed FET gate drive voltages.

Accordingly, there is a need to be able to select among multiple different positive and/or multiple different negative FET gate drive voltages for FETs in which well-tuned gate drive voltages are needed or desirable for optimal results. The present invention addresses this need.

SUMMARY OF THE INVENTION

The invention encompasses circuits and corresponding methods that provide for selection among multiple different positive and/or multiple different negative FET gate drive voltages for FETs in which well-tuned gate drive voltages are needed or desirable for optimal results in an RF circuit.

Embodiments of the invention include FET gate drive voltage generator circuit configurations which provide multiple different positive and/or multiple different negative FET gate drive voltages. If the voltage generators include charge pumps with a feedback control system, then the multiple different positive and/or multiple different negative FET gate drive voltages may be generated by: (1) adjusting the output voltage of at least one positive voltage generator and/or at least one negative voltage generator by adjusting the voltage of a feedback signal; and/or (2) adjusting the output voltage of at least one positive voltage generator and/or at least one negative voltage generator by adjusting the voltage of a reference voltage source; and/or (3) adjusting the feed voltage supplied to at least one positive voltage generator and/or at least one negative voltage generator. In various embodiments, the voltage generators may be digital-to-analog converters (DACs).

In alternative embodiments, an IC may include multiple positive voltage generators and/or multiple negative voltage generators, each voltage generator providing an output voltage different from at least one other voltage generator, and each voltage generator being connected or connectable to one or more level shifters to drive the gates of one or more FETs.

Each FET device requiring a well-tuned gate drive voltage is selectably coupled to one set of positive and negative voltage generators, or to multiple sets of positive and negative voltage generators through a selector component. In some embodiments, the voltage adjustment control signals or the selector control signal values may be supplied by other circuitry internal to the same IC on which the voltage generator or generators are fabricated, or from an external source, such as by way of the well-known interfaces specified by the MIPI (Mobile Industry Processor Interface) Alliance, or by the well-known Serial Peripheral Interface (SPI) bus, or by direct control signal pins, or by any other convenient means. The voltage adjustment control signal values and selector control signal values may be set in various ways, such as at the time of manufacture, after testing or by a customer, or under program control. However, a particularly useful embodiment is an SOI IC that includes one or more variable voltage generators that provide variable positive and/or negative FET gate drive voltages under program control.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention encompasses circuits and corresponding methods that provide for selection among multiple different positive and/or multiple different negative FET gate drive voltages for FETs in which well-tuned gate drive voltages are needed or desirable for optimal results in an RF circuit, particularly an RF circuit manufactured with an SOI technology.

Context

Figure 1:
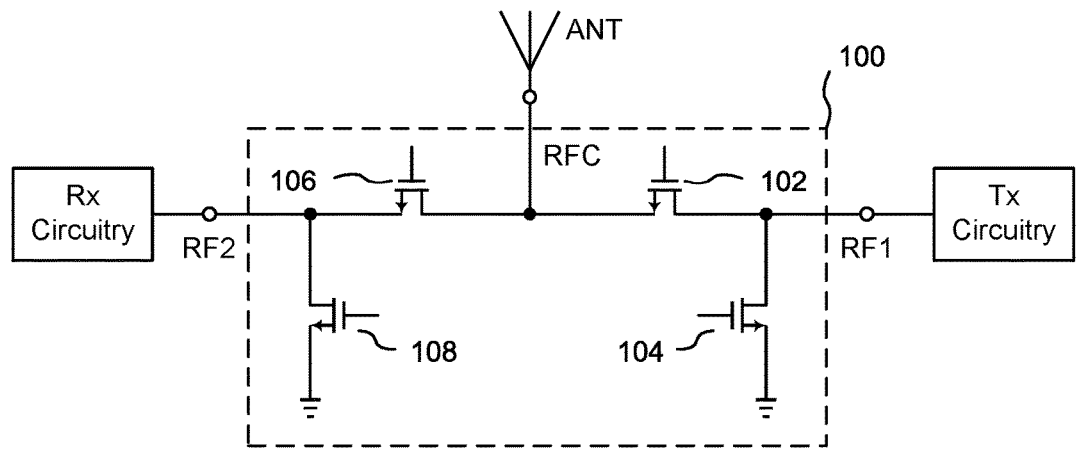
FIG. 1 is a schematic diagram of an RF switch circuit in a transmit/receive circuit with FET switch devices defining signal paths.

FIG. 1 is a schematic diagram of an RF switch circuit 100 in a transmit/receive circuit with FET switch devices defining signal paths. In this example, the RF switch circuit 100 has a port RF1 coupled to transmitter circuitry Tx and a port RF2 coupled to receiver circuitry Rx. A common port RFC of the RF switch circuit 100 is shown coupled to an antenna ANT.

Signal propagation between the antenna ANT and either the transmitter circuitry Tx or the receiver circuitry Rx is controlled by the states of FETs 102 through 108. Signals pass between Tx and ANT when FET 102 is "ON" (conducting), FET 104 is "OFF" (non-conducting), FET 106 is "OFF", and FET 108 is "ON" (conducting and shunting to circuit ground). Similarly, signals pass between Rx and ANT when the state of each FET is reversed (flipped).

As noted above, the transmit signal path generally requires a low insertion loss (IL) and high voltage standoff capability, while the receive signal path has less stringent IL and voltage standoff requirements. Typically, the FET gate drive voltage which creates the best RF performance in a particular signal path (e.g., the transmit signal path) is chosen for all similar FETs, but exposing the FETs in other signal paths to non-optimal or more stressful conditions due to a higher applied gate drive voltage. Thus, it would be desirable to independently select and set the gate drive voltage for each such FET or for groups of such FETs.

Each FET in FIG. 1 is shown with a symbolic gate that is not connected to anything in the drawing. As is known, each gate would actually be coupled to control circuitry, usually through a resistor, that controls switching the corresponding FET "ON" (conducting) or "OFF" (non-conducting). (As should be clear, the FETs in these examples are being used as binary switching devices, and not as variable resistors).

Figure 2:
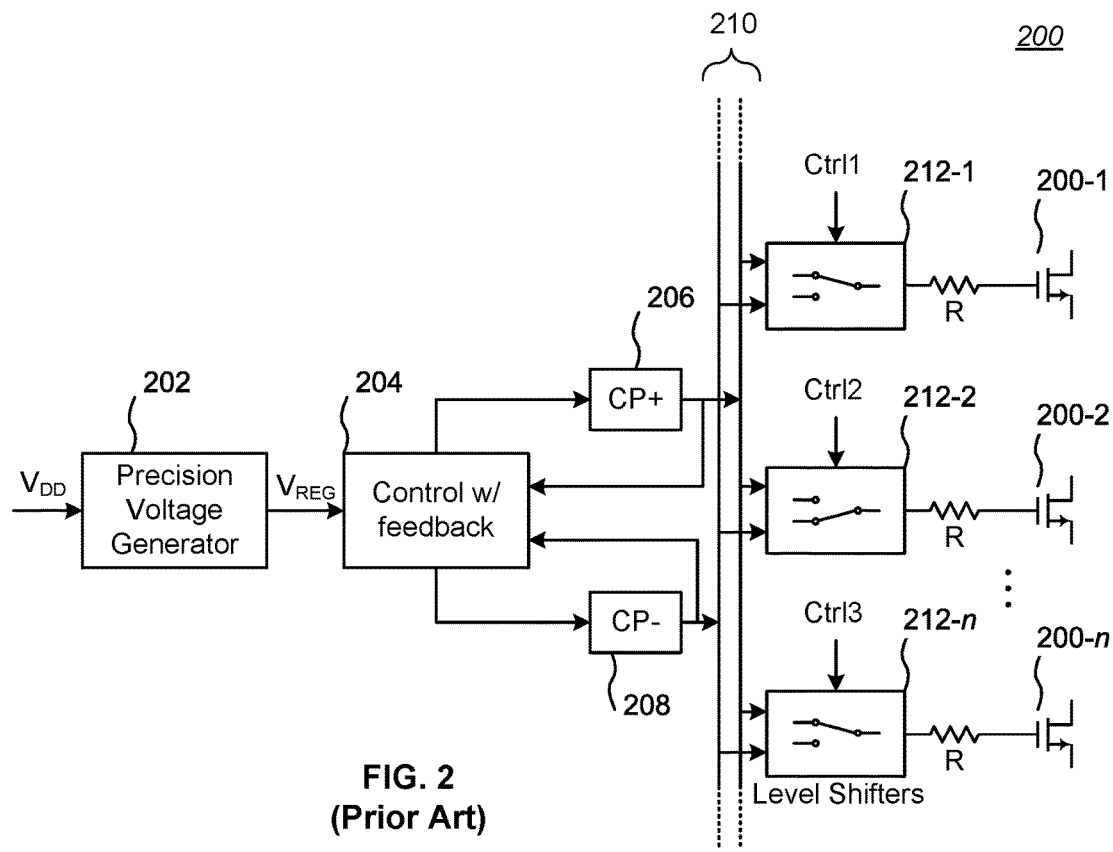
FIG. 2 is a high-level block diagram of an example conventional gate drive voltage circuit coupled to a set of RF FETs.

FIG. 2 is a high-level block diagram of an example conventional gate drive voltage circuit coupled to a set of RF FETs 200-1 to 200-n. In this example, a conventional precision voltage generator 202 is powered by an IC voltage supply $V_{DD}$, which may vary over a range of voltages. The precision voltage generator 202 generates a well-regulated feed voltage output $V_{REG}$, which is coupled to and powers a control circuit 204. The control circuit 204 regulates the output of two charge pumps 206, 208. One charge pump 206 outputs a positive gate drive voltage (CP+), and the other charge pump 208 outputs a negative gate drive voltage (CP−). The positive and negative gate drive voltages are coupled to a bus 210, to which are coupled a set of level shifters 212-1 to 212-n, each of which corresponds to one of the FETs 200-1 to 200-n. Each of the FETs 200-1 to 200-n are coupled to a respective level shifter 212-1 to 212-n through an associated resistor R. Each level shifter 212-1 to 212-n is effectively a simple switch coupled to control circuitry (not shown) that provides a corresponding control signal Ctrlx. The control signal Ctrlx selects which of the two gate drive voltages, CP+ or CP− (i.e., a voltage level, hence the name "level shifter") to apply to an associated FET 200-1 to 200-n to cause that FET either to turn ON or to turn OFF.

Figure 3:
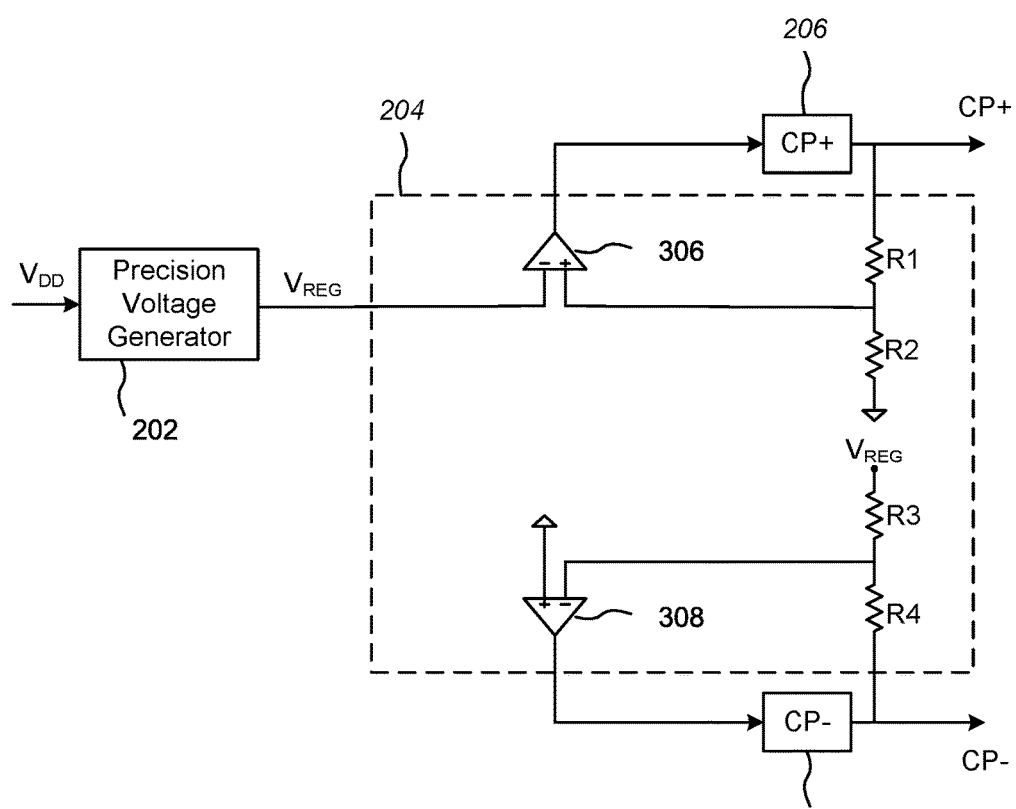
FIG. 3 is a more detailed block diagram of the example conventional gate drive voltage circuit of FIG. 2.

FIG. 3 is a more detailed block diagram of the example conventional gate drive voltage circuit of FIG. 2. As in FIG. 2, a precision voltage generator 202 powered by the IC voltage supply $V_{DD}$ generates a well-regulated feed voltage output $V_{REG}$ which is coupled to and powers the control circuit 204. The control circuit 204 includes two differential amplifiers 306, 308, the output of each of which is coupled to and regulates the gate drive voltage output CP+, CP− of a corresponding charge pump 206, 208. In the illustrated embodiment, the gate drive voltage output CP+, CP− of each charge pump 206, 208 is fed back at a reduced level to a first input of its controlling differential amplifier 306, 308 through a corresponding voltage divider (R1, R2, and circuit ground coupled to the charge pump 206 output CP+, and $V_{REG}$, R3, and R4 coupled to the charge pump 208 output CP−). In the illustrated embodiment, the second input of differential amplifier 306 is a reference voltage (which may be $V_{REG}$, as shown) while the second input of differential amplifier 308 is generally circuit ground; the second input in both cases serves as a reference voltage level.

In operation, each differential amplifier 306, 308 compares a reference voltage ($V_{REG}$ or circuit ground, as the case may be in the illustrated embodiment) to the feedback voltage from a corresponding charge pump 206, 208. Any difference in the signals compared by a differential amplifier 306, 308 causes the output of such differential amplifier 306, 308 to move above or below a nominal "zero" level, which in turn causes the corresponding coupled charge pump 206, 208 to increase or decrease its gate drive voltage output CP+, CP−, which in turn is fed back through a corresponding voltage divider to a corresponding differential amplifier 306, 308. Accordingly, the control circuit 204 is a conventional closed-loop feedback controller for the charge pumps 206, 208.

Variable Gate Drive Voltage Generator

The gate drive voltage circuits of FIG. 2 and FIG. 3 are designed to provide positive and negative gate voltages to multiple FETs on an IC that require well-tuned gate drive voltages (noting again that, as used herein, "positive gate voltage" means the voltage level required to turn a FET "ON", and "negative gate voltage" means the voltage level required to turn a FET "OFF"). Generally, all or most RF or switch FETs will need such voltages. However, as discussed above, not all of such FETs on an IC need be—or should be—driven at the same voltages, and in some cases, it is desirable to temporarily apply larger magnitude voltages to FETs (particularly RF signal switching FETs) to stress test them.

Figure 4:
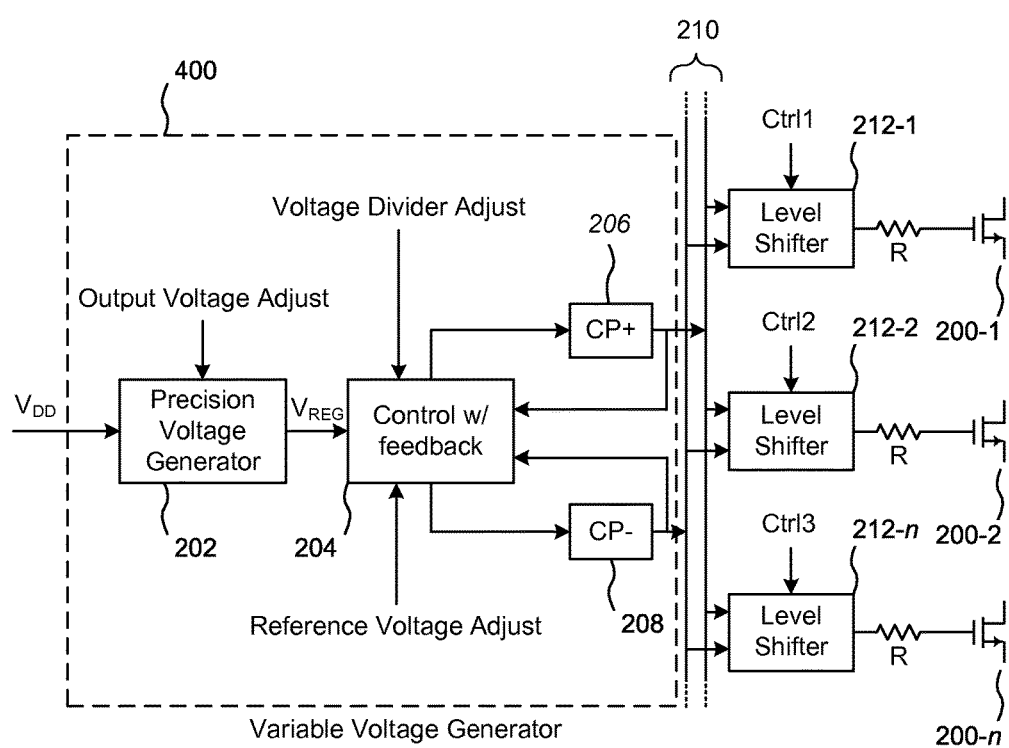
FIG. 4 is a high-level block diagram of one embodiment of a variable voltage generator coupled to a set of RF FETs in accordance with the present invention.

FIG. 4 is a high-level block diagram of one embodiment of a variable voltage generator 400 coupled to a set of RF FETs 200-1 to 200-n in accordance with the present invention. The illustrated embodiment is similar in a number of respects to the gate drive voltage circuit shown in FIG. 2. Thus, the variable voltage generator 400 includes a conventional precision voltage generator 202 powered by an IC voltage supply $V_{DD}$ that generates a regulated voltage output $V_{REG}$ coupled to a control circuit 204. The control circuit 204 regulates the output of two charge pumps 206, 208. One charge pump 206 outputs a positive gate drive voltage (CP+), and the other charge pump 208 outputs a negative gate drive voltage (CP−). The positive and negative gate drive voltages are coupled to a bus 210, to which are coupled a set of level shifters 212-1 to 212-n, each of which corresponds to a FET 200-1 to 200-n. Each of the FETs 200-1 to 200-n are coupled to a respective level shifter 212-1 to 212-n through an associated resistor R. Each level shifter 212-1 to 212-n is coupled to control circuitry (not shown) that provides a corresponding control signal Ctrlx. The control signal Ctrlx selects which of the two gate drive voltages, CP+ or CP−, to apply to its associated FET to cause that FET either to turn ON or to turn OFF.

However, in a significant departure from the gate drive voltage circuit of FIG. 2, the illustrated variable voltage generator 400 may include any of three different ways of adjusting the gate drive voltage output CP+ of the positive charge pump 206 and the gate drive voltage output CP− of the negative charge pump 208. For example, the internal settings of the precision voltage generator 202 may be varied as a function of an Output Voltage Adjust control signal to cause its output voltage, $V_{REG}$, to vary. In addition or alternatively, the reference voltages internal to the control circuit 204 may be varied as a function of a Reference Voltage Adjust control signal to bias the regulator signals to the charge pumps 206, 208, thereby modifying the positive gate drive voltage CP+ and/or the negative gate drive voltage CP−. In addition or alternatively, the feedback circuit from the charge pumps 206, 208 to the control circuit 204 can be adjusted by a Feedback Voltage Adjust control signal to bias the regulator signal output of the control circuit 204 to the charge pumps 206, 208, again thereby modifying the positive gate drive voltage CP+ and/or the negative gate drive voltage CP−.

Figure 5:
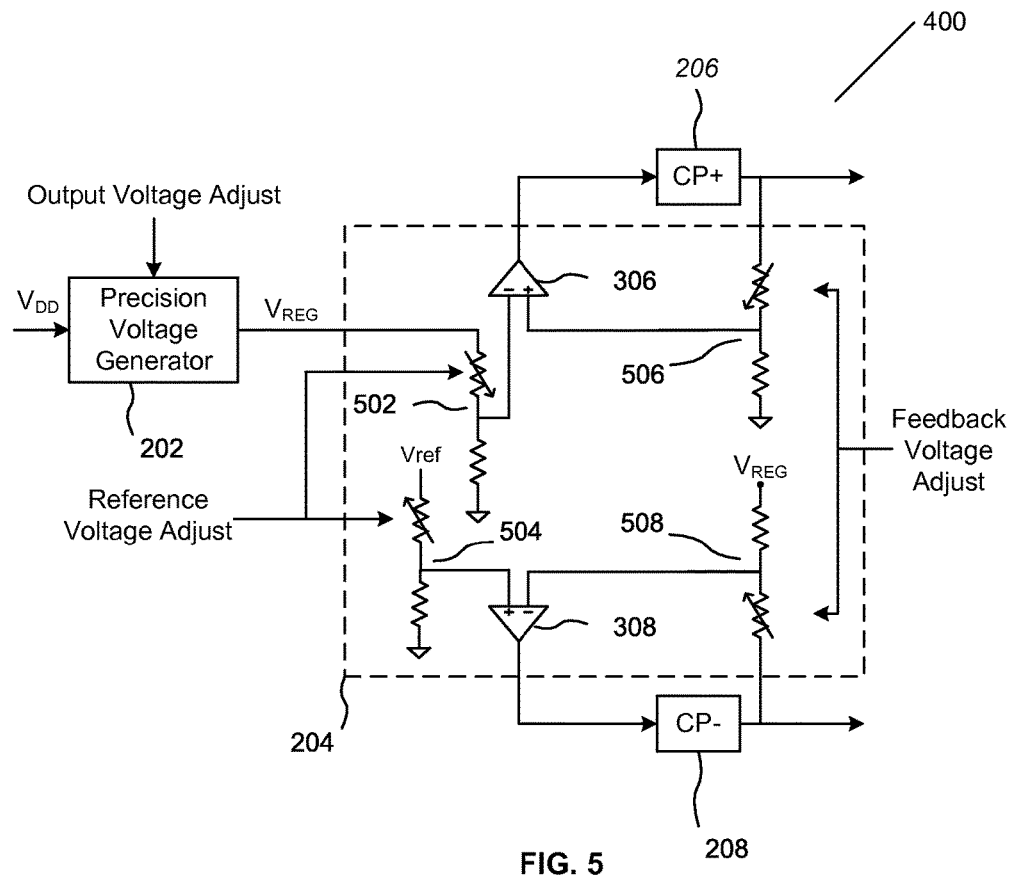
FIG. 5 is a more detailed block diagram of the variable voltage generator circuit of FIG. 4.

FIG. 5 is a more detailed block diagram of the variable voltage generator circuit 400 of FIG. 4. As noted above, an Output Voltage Adjust control signal may be coupled to the precision voltage generator 202 to adjust, in known fashion, the internal settings of the precision voltage generator 202. This may be done in a number of ways, such as by changing the bias of one or more circuit elements using, for example, a DAC or a variable voltage divider (see discussion of FIG. 6 below. Doing so will in turn change the voltage of $V_{REG}$, which will affect the comparison threshold of both the "positive" differential amplifier 306 and the "negative" differential amplifier 308.

In addition or alternatively, the reference voltages internal to the control circuit 204 may be varied as a function of a Reference Voltage Adjust control signal. For example, a voltage divider circuit 502, 504 may be coupled to the reference inputs of one or both of the differential amplifiers 306, 308. As is well known, a resistive voltage divider produces an output voltage that is a fraction of its input voltage, the output voltage magnitude being a function of the relative resistance values of the two component resistor elements. In the illustrated embodiment, one or both of the component resistor elements of the voltage divider circuits 502, 504 may be variable (it does not matter which resistor element if only one resistor element is made variable). Applying the Reference Voltage Adjust control signal to vary one or more of the variable component resistor elements of the voltage divider circuits 502, 504 will bias the output of the corresponding differential amplifier 306, 308, which in turn will bias the charge pumps 206, 208, thereby modifying the positive gate drive voltage CP+ and/or the negative gate drive voltage CP−. In some embodiments, separate Reference Voltage Adjust control signals may be applied to the control circuit 204 to independently control the positive gate drive voltage CP+ and the negative gate drive voltage CP−.

In a similar manner, voltage divider feedback circuits 506, 508 from the charge pumps 206, 208 to the differential amplifiers 306, 308 of the control circuit 204 can be adjusted by a Feedback Voltage Adjust control signal. In the illustrated embodiment, one or both of the component resistor elements of the voltage divider feedback circuits 506, 508 may be variable (again, it does not matter which resistor element if only one resistor element is made variable). Applying the Feedback Voltage Adjust control signal to vary one or more of the variable component resistor elements of the voltage divider circuits 506, 508 will bias the output of the corresponding differential amplifier 306, 308, which in turn will bias the charge pumps 206, 208, thereby modifying the positive gate drive voltage CP+ and/or the negative gate drive voltage CP−. In some embodiments, separate Feedback Voltage Adjust control signals may be applied to the control circuit 204 to independently control the positive gate drive voltage CP+ and the negative gate drive voltage CP−.

Figure 6:
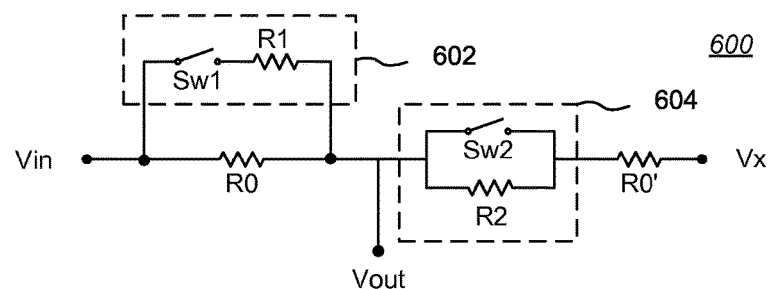
FIG. 6 is a schematic diagram of one example of a variable voltage divider circuit that may be used in the circuit of FIG. 5.

FIG. 6 is a schematic diagram of one example of a variable voltage divider circuit 600 that may be used in the circuit of FIG. 5. In the illustrated embodiment, resistors R0, R0' provide the base voltage divider function; Vx will typically be circuit ground, and Vout would then be equal to Vin×R0'/(R0+R0'). In this example, the base resistance on either "side" of the Vout node may be changed in either of two ways. By closing switch Sw1 in parallel resistive element 602, resistor R1 will be coupled in parallel with R0, thereby reducing the effective resistance between Vin and Vout. In addition or alternatively, by closing switch Sw2 in serial resistive element 604, resistor R2 will be coupled in series with R0', thereby increasing the effective resistance between Vout and Vx (i.e., ground in this case). Of course, fewer or more such parallel and/or serial resistive elements 602, 604 can be included on either side of the variable voltage divider circuit 600 to provide a different number of variable resistance states.

Other means of providing a variable voltage divider circuit include, for example, using a digital step attenuator (DSA) of the type described in U.S. Patent Application No. US20150137913 A1, entitled "Segmented Attenuator with Glitch Reduction" and assigned to the assignee of the present invention, as one or more of the component resistor elements of the voltage divider.

It is important to note that, while FIG. 4 and FIG. 5 show a particular embodiment of a variable voltage generator 400, the concepts of the invention extend to other circuits that can perform the same function as the illustrated variable voltage generator 400 by providing variable positive and/or negative FET gate drive voltages. Examples of such alternative variable voltage generators include (without limitation):

- one or more digital-to-analog converters (DACs), which convert a digital input signal to an analog voltage, in known fashion;
- one or more low-dropout (LDO) regulators powered by $+V_{DD}$ to create a variable positive gate drive voltage (thus, the positive charge pump may be omitted);
- one or more internal LDO regulators powered by an internally generated or externally provided negative voltage supply to create a variable negative gate drive voltage; and
- the combination of a voltage charge pump with a fixed voltage output (CP+ and/or CP−) and direct regulation of that output (e.g., using a step-down, LDO, or other DC-to-DC regulator) to create a desired variable gate voltage.

In some embodiments, positive FET gate drive voltages may be provided by one type of variable voltage generator while negative FET gate drive voltages may be provided by a different type of variable voltage generator; for example; negative voltages may be provided by a charge pump-based variable voltage generator (or one of the other variable voltage generators noted above) while positive voltages may be provided by a DAC (or one of the other variable voltage generators noted above). Further, while the various adjustment control signals described above have been characterized as voltages, similar functionality may be achieved by the application of control currents, particularly since a current can be readily converted to a voltage if need be. In addition, while FIG. 4 and FIG. 5 show a configuration in which a single control circuit 204 controls both a positive charge pump 206 and a negative charge pump 208, separate control circuits may be assigned to each charge pump.

For a number of purposes, simply having the ability internal to an IC to adjust the positive and/or negative FET gate drive voltages is useful even if all FETs on the IC that require well-tuned gate drive voltages are coupled to the same variable voltage generator. For example, during testing (e.g., to assess RF lifetime versus FET gate drive voltage levels), it may be desirable to overdrive the FET gate voltages from the variable voltage generator to stress each FET device; as noted above, increased device stress reduces lifetime and thus shortens testing time.

As another example, having one or more on-chip variable voltage generators allows RF characterization (e.g., testing insertion loss, isolation, linearity) relative to FET gate drive voltage effects (e.g., leakage, breakdown), thereby enabling FET gate drive voltage optimization for each particular IC design and even for individual ICs (i.e., per IC testing and optimization).

Multiple Gate Drive Voltage Generators

In alternative embodiments, a single IC may include multiple gate drive voltage generators. Different gate drive voltages may be achieved by using multiple instances of fixed output voltage generators and/or variable voltage generators.

Figure 7:
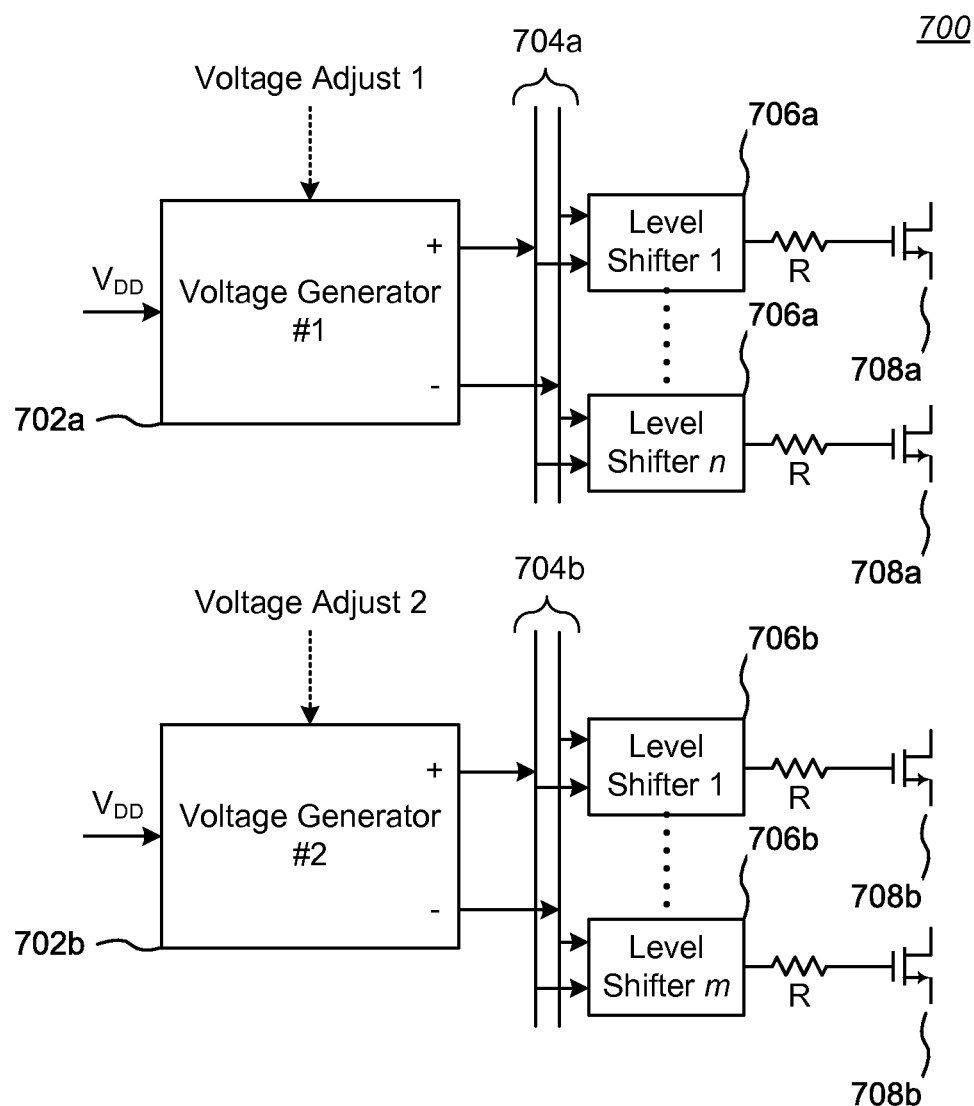
FIG. 7 is a block diagram of a circuit that includes two variable voltage generators.

FIG. 7 is a block diagram of a circuit 700 that includes two voltage generators 702a, 702b. In this example, the two illustrated voltage generators 702a, 702b may or may not be variable; if variable, then each is coupled to a corresponding Voltage Adjust X control signal (shown with a dotted-line connection to denote the optional nature), which may, for example, be any one or more of the voltage adjust control signals shown in FIG. 5. Each voltage generator 702a, 702b is coupled through a corresponding bus 704a, 704b to a set of level shifters 706a, 706b. The buses 704a, 704b are independent of each other.

In the illustrated embodiment, the set of level shifters 706 comprises n units, while the set of level shifters 706 comprises m units; both n and m are integers greater than zero, and n may equal m. Each level shifter 706a, 706b is shown coupled through a resistor R to the gate of a corresponding FET 708a, 708b; control signal lines to the level shifters 706a, 706b have been omitted for clarity.

In operation, the two voltage generators 702a, 702b each output positive and negative gate drive voltages, at least one voltage being different between the two voltage generators. For example, voltage generator 702a may output +1.5V and −0.9V, while voltage generator 702b may output +3.0V and −3V. If the two voltage generators 702a, 702b are variable, each can be programmed to output desired positive and negative gate drive voltage levels by means of a corresponding Voltage Adjust X control signal. Thus, if one group or "channel" of FETs (e.g., FETs 708a) requires high performance and the other group or "channel" of FETs (e.g., FETs 708b) does not, higher voltage magnitudes can be supplied to the high performance channel while power and stress can be reduced in the lower performance channel. If the two voltage generators 702a, 702b are variable, the performance levels for each channel may be set automatically (e.g., by measuring signal power through other circuitry, not shown) or under programmatic or manual control.

Figure 8:
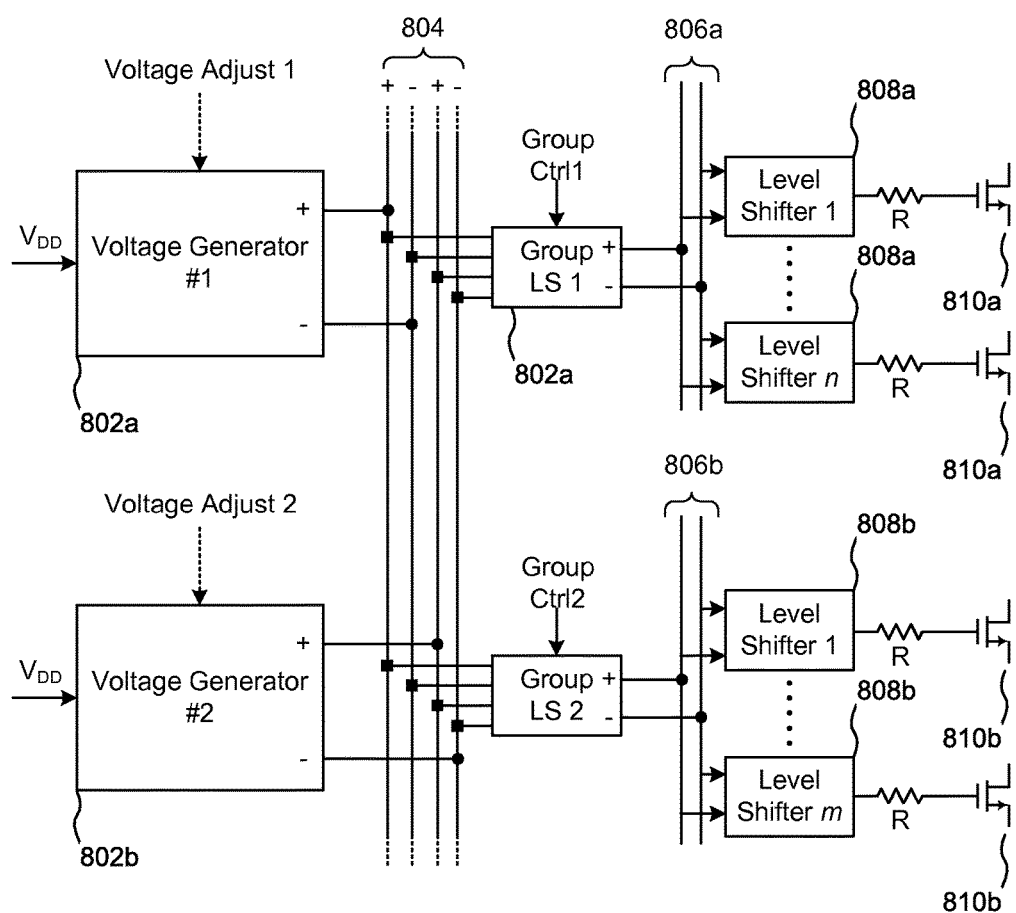
FIG. 8 is a block diagram of a circuit showing an alternative way of distributing multiple FET gate drive voltages from multiple gate drive voltage generators.

FIG. 8 is a block diagram of a circuit 800 showing an alternative way of distributing multiple FET gate drive voltages from multiple gate drive voltage generators 802a, 802b. In this example, the two illustrated voltage generators 802a, 802b may or may not be variable; if variable, then each is coupled to a corresponding Voltage Adjust X control signal (shown with a dotted-line connection to denote the optional nature), which may, for example, be any one or more of the voltage adjust control signals shown in FIG. 5. As with the example shown in FIG. 7, if the two voltage generators 802a, 802b are not variable, each generator would be set or programmed to output at least one voltage level, positive or negative, different from the voltage levels output by the other generator (thus, the two voltage generators 802a, 802b do not have identical output voltage levels).

The positive and negative voltage outputs of the voltage generators 802a, 802b are coupled to a multiple-lane primary bus 804. Also coupled to the primary bus 804 are two group level shifters 806a, 806b that essentially act as selectors or multiplexors to select and output one positive and one negative voltage to corresponding secondary buses 806a, 806b in response to a corresponding Group Ctrl X signal. The secondary buses 806a, 806b are independent of each other.

Each secondary bus 806a, 806b is coupled to a corresponding set of secondary level shifters 808a, 808b. In the illustrated embodiment, the set of secondary level shifters 808a comprises n units, while the set of secondary level shifters 808b comprises m units; both n and m are integers greater than zero, and n may equal m. Each secondary level shifter 808a, 808b is shown coupled through a resistor R to the gate of a corresponding FET 810a, 810b; control signal lines to the secondary level shifters 808a, 808b have been omitted for clarity.

In operation, the two voltage generators 802a, 802b each output positive and negative gate drive voltages, at least one voltage being different between the two voltage generators. If the two voltage generators 802a, 802b are variable, each can be programmed to output desired positive and negative gate drive voltage levels by means of a corresponding Voltage Adjust X control signal. Thus, in the illustrated embodiment, the primary bus 804 carries two positive and two negative voltage levels. Under the control of a corresponding Group Ctrl X signal, each group level shifter 806a, 806b selects and outputs one positive and one negative voltage level to a corresponding secondary bus 806a, 806b. Accordingly, as with the configuration shown in FIG. 7, if one group or "channel" of FETs (e.g., FETs 810a) requires high performance and the other group or "channel" of FETs (e.g., FETs 810b) does not, higher voltage magnitudes can be supplied to the high performance channel and power and stress can be reduced in the lower performance channel. As with the embodiment of FIG. 7, if the two voltage generators 802a, 802b are variable, the performance levels for each channel may be set automatically (e.g., by measuring signal power through other circuitry, not shown) or under programmatic or manual control.

As should be clear, while FIG. 7 and FIG. 8 each show two voltage generators and two groups of FETs, and FIG. 8 shows two group level shifters, the illustrated principals apply to ICs with more than two voltage generators, two groups of FETs, and/or two group level shifters. In addition, in some applications, a common positive or a common negative gate drive voltage may be supplied to level shifters for all FETs requiring such voltages, while multiple levels of the opposite polarity voltage are connected or connectable to level shifters for such FETs (e.g., where two positive gate drive voltages and only one negative gate drive voltage are generated on a particular IC).

Alternative Embodiments

Embodiments of the invention include FET gate drive voltage generator configurations which provide multiple different positive and/or multiple different negative FET gate drive voltages. In some embodiments, one or more variable voltage generators may be combined with one or more fixed voltage generators to provide a combination of different positive and negative FET gate drive voltages. For example, only the positive gate voltage generator may be variable, while the negative gate voltage generator outputs a fixed voltage (or vice versa).

If the voltage generators include charge pumps with a feedback control system, then the multiple different positive and/or multiple different negative FET gate drive voltages may be generated by: (1) adjusting the output voltage of at least one positive voltage generator and/or at least one negative voltage generator by adjusting the voltage of a feedback signal; and/or (2) adjusting the output voltage of at least one positive voltage generator and/or at least one negative voltage generator by adjusting the voltage of a reference voltage source; and/or (3) adjusting the feed voltage supplied to at least one positive voltage generator and/or at least one negative voltage generator. In alternative embodiments, an IC may include multiple positive voltage generators and/or multiple negative voltage generators, each voltage generator providing an output voltage different from at least one other voltage generator, and each voltage generator being connected or connectable to one or more level shifters to drive the gates of one or more FETs. In various embodiments, the voltage generators may be digital-to-analog converters (DACs).

Each FET device requiring a well-tuned gate drive voltage is selectably coupled to one set of positive and negative voltage generators, or to multiple sets of positive and negative voltage generators through a selector component. In the embodiments described above, the voltage adjustment control signals or the selector component signal values may be supplied by other circuitry internal to the same IC on which the voltage generator or generators are fabricated, or from an external source, such as by way of the well-known interfaces specified by the MIPI (Mobile Industry Processor Interface) Alliance, or by the well-known Serial Peripheral Interface (SPI) bus, or by direct control signal pins, or by any other convenient means. The voltage adjustment control signal values and selector component signal values may be set in various ways, such as at the time of manufacture (e.g., by application of one or more mask layers to set a configuration), after testing or by a customer (e.g., by "blowing" fusible links), or under program control (e.g., by the use of look-up tables external or internal to an IC that includes the variable voltage generator). However, a particularly useful embodiment is an SOI IC that includes one or more variable voltage generators that provide variable positive and/or negative FET gate drive voltages under program control.

Methods

Another aspect of the invention includes a method for providing gate drive voltages to at least one FET within an integrated circuit, including:
  providing a first variable gate drive voltage to each FET from a first adjustable circuit responsive to a first adjustment control signal; and
  providing a second gate drive voltage to each FET from a second circuit.

In some embodiments of this method, the second circuit may be an adjustable circuit responsive to a second adjustment setting for providing a variable second gate drive voltage to each FET.

Yet another aspect of the invention includes a method for providing gate drive voltages to a plurality of FETs within an integrated circuit, including:
  configuring the FETs into a plurality of groups; and
  providing a positive gate drive voltage and a negative gate drive voltage to each group of FETs, wherein at least one of the positive gate drive voltage and negative gate drive voltage provided to at least one of the groups of FETs differs from at least one of the positive gate drive voltage and negative gate drive voltage provided to at least one other of the groups of FETs.

Still another aspect of the invention includes a method for providing gate drive voltages to a plurality of FETs within an integrated circuit, including:
  configuring the FETs into a plurality of groups;
  providing a plurality of gate drive voltages to a multiple-lane bus, including at least two gate drive voltages of a first polarity and at least one gate drive voltage of a second polarity, wherein at least two of the gate drive voltages having the same polarity differ in magnitude; and selectively providing only one of a positive gate drive voltage and only one of a negative gate drive voltage from the multiple-lane bus to each group of FETs.

Additional aspects of the above methods may include: varying at least one of the positive gate drive voltages and negative gate drive voltages in response to an adjustment control signal; configuring at least one FET to controllably switch a radio frequency signal in response to selective application of the provided variable positive gate drive voltage and variable negative gate drive voltage; and/or fabricating the integrated circuit using a silicon-on-insulator (SOI) fabrication technology.

Fabrication

While the term "MOSFET" technically refers to metal-oxide-semiconductors, it has become a common label for most types of IGFETs. It is well known that the "metal" in the name MOSFET is now often a misnomer because the previously metal gate material is now often a layer of polysilicon (polycrystalline silicon). Similarly, the "oxide" in the name can be a misnomer, as different dielectric materials are used with the aim of obtaining strong channels with smaller applied voltages. Another synonym for MOSFET is "MISFET", for metal-insulator-semiconductor FET. Accordingly, the term "MOSFET" as used herein is not to be read as literally limited to metal-oxide-semiconductors.

As should be readily apparent to one of ordinary skill in the art, various embodiments of the invention can be implemented to meet a wide variety of specifications. Unless otherwise noted above, selection of suitable component values are a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics with respect to well-tuned gate drive voltages. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to handle greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. An integrated circuit including a voltage generator for providing gate drive voltages to at least one field effect transistor (FET) within such integrated circuit, the voltage generator including:
   (a) a first adjustable circuit responsive to a first adjustment setting for providing a variable first gate drive voltage;
   (b) a second circuit for concurrently providing a second gate drive voltage; and
   (c) for at least one FET, a corresponding level shifter, coupled to the variable first gate drive voltage and the second gate drive voltage, and coupled to a gate of the corresponding FET, for selectively providing the variable first gate drive voltage or the second gate drive voltage to the gate of the corresponding FET.

2. The integrated circuit of claim 1, wherein the second circuit is an adjustable circuit responsive to a second adjustment setting for providing a variable second gate drive voltage.

3. The integrated circuit of claim 1, wherein at least one FET controllably switches a radio frequency signal in response to selective application of the provided variable first gate drive voltage and second gate drive voltage.

4. The integrated circuit of claim 1, wherein the integrated circuit is fabricated using a silicon-on-insulator (SOI) fabrication technology.

5. An integrated circuit including:
   (a) a plurality of groups, each group including at least one field effect transistor (FET) configured as a signal switching device; and
   (b) a plurality of voltage generators, each voltage generator for providing at least one of a positive gate drive voltage and a negative gate drive voltage to each FET within a corresponding group of FETs;
   wherein the at least one positive gate drive voltage and negative gate drive voltage of at least one of the plurality of voltage generators differs from the at least one positive gate drive voltage and negative gate drive voltage of at least one other of the plurality of voltage generators.

6. The integrated circuit of claim 5, wherein the at least one of a positive gate drive voltage and a negative gate drive voltage of at least one of the plurality of voltage generators is variable in response to an adjustment control signal.

7. The integrated circuit of claim 5, wherein at least one FET controllably switches a radio frequency signal in response to selective application of the provided positive gate drive voltage and negative gate drive voltage.

8. The integrated circuit of claim 5, wherein the integrated circuit is fabricated using a silicon-on-insulator (SOI) fabrication technology.

9. An integrated circuit including:
   (a) a plurality of groups, each group including at least one field effect transistor (FET) configured as a signal switching device;

(b) a plurality of voltage generators, each voltage generator coupled to a multiple-lane bus, for providing at least one of a positive gate drive voltage and a negative gate drive voltage to the multiple-lane bus; and (c) a plurality of selectors, each coupled to the multiple-lane bus and to a corresponding group, for providing only one of a positive gate drive voltage and only one of a negative gate drive voltage from the multiple-lane bus to the corresponding group of FETs;

wherein the at least one positive gate drive voltage and negative gate drive voltage of at least one of the plurality of voltage generators differs from the at least one positive gate drive voltage and negative gate drive voltage of at least one other of the plurality of voltage generators.

10. The integrated circuit of claim 9, wherein the at least one of a positive gate drive voltage and a negative gate drive voltage of at least one of the plurality of voltage generators is variable in response to an adjustment control signal.

11. The integrated circuit of claim 9, wherein at least one FET controllably switches a radio frequency signal in response to selective application of the provided positive gate drive voltage and negative gate drive voltage.

12. The integrated circuit of claim 9, wherein the integrated circuit is fabricated using a silicon-on-insulator (SOI) fabrication technology.

13. An integrated circuit including a voltage generator for providing gate drive voltages to at least one field effect transistor (FET) within such integrated circuit, the voltage generator including:

(a) a precision voltage generator, coupled to a supply voltage, for outputting a well-regulated feed voltage;

(b) at least one control circuit, coupled to and powered by the feed voltage, for comparing at least one reference voltage to a corresponding at least one feedback voltage and generating at least one corresponding control output;

(c) at least one charge pump, each coupled to the control output of a corresponding control circuit, for generating a variable positive or a variable negative output voltage having a magnitude controlled by the control output of the corresponding control circuit, wherein the output voltage is coupled to the corresponding control circuit and the at least one feedback voltage of such corresponding control circuit is derived from such output voltage; and (d) at least one control signal input, coupled to at least one of the precision voltage generator and the at least one control circuit, for varying the output voltage of the at least one charge pump coupled to the control output of a corresponding at least one control circuit;

wherein the voltage generator is coupled to at least en one FET and provides at least one of a variable positive gate drive voltage and a variable negative gate drive voltage to such at least one FET.

14. The integrated circuit of claim 13, wherein at least one FET controllably switches a radio frequency signal in response to selective application of the provided variable positive gate drive voltage and variable negative gate drive voltage.

15. The integrated circuit of claim 13, wherein the integrated circuit is fabricated using a silicon-on-insulator (SOI) fabrication technology.

16. A method for providing gate drive voltages to at least one field effect transistor (FET) within an integrated circuit, including:

(a) providing a variable first gate drive voltage from a first adjustable circuit responsive to a first adjustment control signal;

(b) providing a concurrent second gate drive voltage from a second circuit; and (c) for at least one FET, selectively coupling one of the variable first gate drive voltage or the second gate drive voltage to a gate of the at least one FET.

17. The method of claim 16, wherein the second circuit is an adjustable circuit responsive to a second adjustment control signal for providing a variable second gate drive voltage.

18. The method of claim 16, further including configuring at least one FET to controllably switch a radio frequency signal in response to selective application of the provided variable first gate drive voltage and second gate drive voltage.

19. The method of claim 16, further including fabricating the integrated circuit using a silicon-on-insulator (SOI) fabrication technology.

20. A method for providing gate drive voltages to a plurality of field effect transistors (FETs) within an integrated circuit, including:

(a) configuring the FETs into a plurality of groups; and (b) providing a positive gate drive voltage and a negative gate drive voltage to each group of FETs;

wherein at least one of the positive gate drive voltage and negative gate drive voltage provided to at least one of the groups of FETs differs from at least one of the positive gate drive voltage and negative gate drive voltage provided to at least one other of the groups of FETs.

21. The method of claim 20, further including configuring at least one FET to controllably switch a radio frequency signal in response to selective application of the provided positive gate drive voltage and negative gate drive voltage.

22. The method of claim 20, further including fabricating the integrated circuit using a silicon-on-insulator (SOI) fabrication technology.

23. A method for providing gate drive voltages to a plurality of field effect transistors (FETs) within an integrated circuit, including:

(a) configuring the FETs into a plurality of groups;

(b) providing a plurality of gate drive voltages to a multiple-lane bus, including at least two gate drive voltages of a first polarity and at least one gate drive voltage of a second polarity, wherein at least two of the gate drive voltages having the same polarity differ in magnitude; and (c) selectively providing only one of a positive gate drive voltage and only one of a negative gate drive voltage from the multiple-lane bus to each group of FETs.

24. The method of claim 23, further including varying at least one of the positive gate drive voltages and negative gate drive voltages in response to an adjustment control signal.

25. The method of claim 23, further including configuring at least one FET to controllably switch a radio frequency signal in response to selective application of the provided positive gate drive voltage and negative gate drive voltage.

26. The method of claim 23, further including fabricating the integrated circuit using a silicon-on-insulator (SOI) fabrication technology.

* * * * *